United States Patent [19]
Ishida et al.

[11] Patent Number: 5,932,012
[45] Date of Patent: Aug. 3, 1999

[54] PASTE APPLICATOR HAVING POSITIONING MEANS

[75] Inventors: Shigeru Ishida, Chiyoda-machi; Haruo Mishina, Ushiku; Yukihiro Kawasumi, Kashiwa; Tomio Yoneda, Chiyoda-machi; Masayuki Saito, Ina-machi; Hiroshi Tsutsumi, Mobara, all of Japan

[73] Assignee: Hitachi Techno Engineering Co., Ltd., Tokyo, Japan

[21] Appl. No.: 08/664,120

[22] Filed: Jun. 14, 1996

[30] Foreign Application Priority Data

Jun. 23, 1995 [JP] Japan ................................. 7-157819
Sep. 29, 1995 [JP] Japan ................................. 7-253444

[51] Int. Cl.⁶ ................................................. B05C 11/00
[52] U.S. Cl. .......................... 118/669; 118/300; 118/323; 118/668; 118/676; 118/679; 118/680; 118/696; 118/697; 118/698; 118/700; 118/706; 118/712; 118/713; 118/714; 156/356; 156/357
[58] Field of Search .................................. 118/300, 323, 118/668, 669, 676, 679, 680, 696, 697, 698, 700, 706, 712, 713, 714; 156/356, 357

[56] References Cited

U.S. PATENT DOCUMENTS 5,415,693  5/1995  Yoneda et al. .
5,437,727  8/1995  Yoneda et al. .

FOREIGN PATENT DOCUMENTS 2-52742  2/1990  Japan .

*Primary Examiner*—Peter Chin
*Assistant Examiner*—Michael P. Colaianni
*Attorney, Agent, or Firm*—Evenson, McKeown, Edwards & Lenahan, P.L.L.C.

[57] ABSTRACT

A paste applicator for drawing a paste film in a desired pattern on a substrate, including a table for detachably supporting a substrate, a paste reservoir tube to be filled with a paste, and a nozzle communicating with the paste reservoir and having a paste discharging port opposing to an upper surface of the substrate mounted on the table. A device is supplied for changing the relative positional relationship between the nozzle and the substrate mounted on the table. The paste is applied onto the substrate to form a desired pattern of the paste. A measuring device measures a position of a paste discharging port of a nozzle exchanged together with the paste reservoir tube by using a paste pattern formed by applying the paste onto the substrate held on the table using the exchanged nozzle. The center of the paste pattern nearly agrees with the center of the paste discharging port. A calculator calculates a positional displacement of the paste discharging port due to the nozzle exchange using the measured result obtained by the measuring device. A positioning device positions the substrate at a desired position with respect to the paste discharging port after nozzle exchange using the result obtained by the calculator.

6 Claims, 13 Drawing Sheets

FIG.7
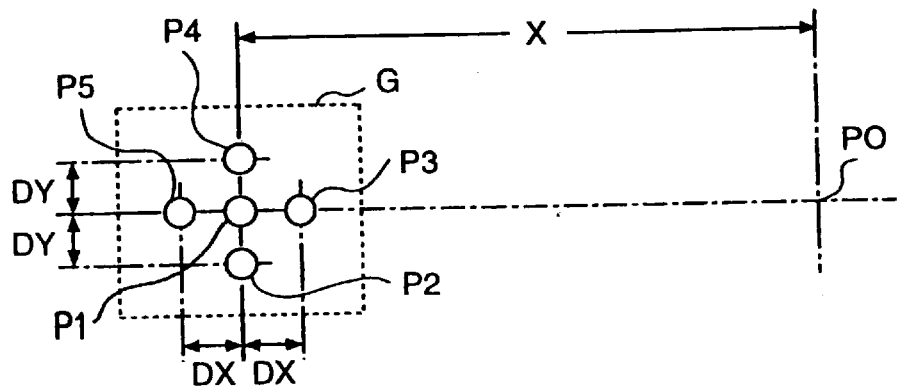
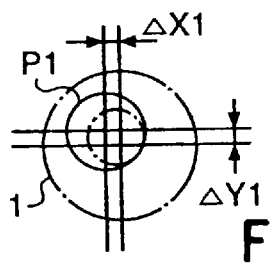
FIG. 8a
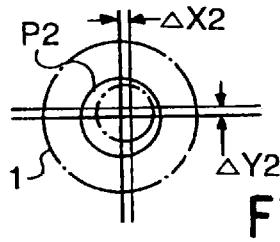
FIG. 8b
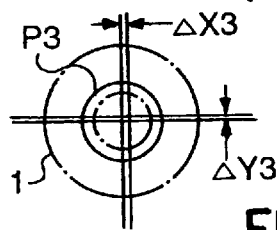
FIG. 8c
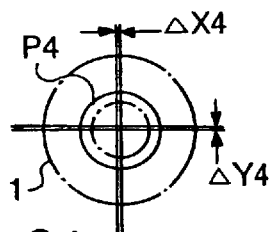
FIG. 8d
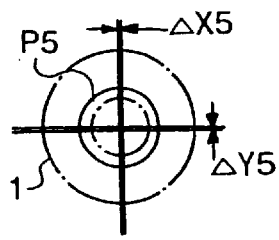
FIG. 8e

PASTE APPLICATOR HAVING POSITIONING MEANS

BACKGROUND OF THE INVENTION

1. Field of the Invention

The present invention relates to a paste applicator for drawing a paste film in a desired pattern on a substrate.

2. Description of the Prior Art

There are known technologies of drawing a paste film in a desired pattern on a substrate by changing the relative positional relationship between a nozzle and the substrate up and down, back and forth, right and left while a paste is being discharged through a nozzle provided at an end of a paste reservoir tube. In a technology disclosed in, for example, Japanese Patent Application Laid-Open No.2-52742 (1990), a desired resistive pattern is formed by discharging a resistive paste through a nozzle onto a substrate while the substrate is being relatively moved to the nozzle and the gap between the nozzle and the substrate is being adjusted.

There are some cases where a paste in a paste reservoir tube is almost discharged by drawing a desired pattern, and lack of the paste occurs halfway through drawing a pattern onto the next substrate. In such a case, refilling a paste into the paste reservoir tube at a midpoint in drawing a pattern causes a structural problem as a precise equipment. Therefore, in such a conventional paste applicator described above, the paste reservoir tube is generally exchanged with a new paste reservoir tube filled with paste before starting drawing of the next substrate. In this occasion, the nozzle is also exchanged because the nozzle is constructed in a one-piece structure with the paste reservoir tube. Hereinafter, such exchange is referred to as "nozzle exchange".

In such a case, the relative position of the nozzle discharging port to the substrate before and after the nozzle exchange is varied due to machining accuracy of the paste reservoir tube or the nozzle and variation of assembling accuracy in the nozzle to the paste reservoir tube. As a result, it has been often difficult to draw a paste pattern starting from a desired position on the substrate.

In a case of drawing, for example, a sealing material in a pattern onto a liquid crystal sealing substrate of a liquid crystal display apparatus, if any positional displacement exists in the pattern of the sealing material, a part of display pixels may be placed outside the pattern of the sealing material and consequently a correct picture cannot be displayed on the screen.

Technologies similar to the above are also disclosed in U.S. Pat. No. 5,415,693 and U.S. Pat. No. 5,437,727 which are invented by the some of inventors of the present invention.

SUMMARY OF THE INVENTION

An object of the present invention is to solve the above problem and to provide a paste applicator capable of drawing a paste pattern accurately at a desired position on a substrate even if a positional displacement of a nozzle discharging port to the substrate occurs due to nozzle exchange.

Another object of the present invention is to provide a paste applicator capable of setting the relative positional relationship between the nozzle discharging port and a substrate accurately and automatically when a positional displacement of a nozzle discharging port to the substrate occurs due to nozzle exchange.

The object of the present invention can be attained by providing a paste applicator comprising a table for detachably mounting a substrate, a paste reservoir tube in which a paste is to be filled, a nozzle communicating with the paste reservoir and having a paste discharging port opposing to an upper surface of the substrate mounted on the table, a means for changing the relative positional relationship between the nozzle and the substrate mounted on the table and applying the paste onto the substrate to form a desired pattern of the paste, a measuring means for measuring a position of a paste discharging port of a nozzle exchanged together with the paste reservoir tube by using a paste pattern, the paste pattern being formed by applying the paste onto the substrate held on the table using the exchanged nozzle, the center of the paste pattern nearly agreeing with the center of the paste discharging port, a calculating means for calculating a positional displacement of the paste discharging port due to the nozzle exchange using the measured result obtained by the measuring means, and a positioning means for positioning the substrate to a desired position with respect to the paste discharging port after nozzle exchange using the result obtained by the calculating means.

In a detailed example, the measuring means described above measures the position of the paste discharging port of the nozzle at the time when the nozzle is exchanged using an arbitrary number of dot-shaped paste patterns (paste applied points) separated from one another on the substrate. Then, the calculating means calculates the displacement of the paste discharging port of the exchanged nozzle through either of statistical processing of the results measured by the measuring means with respect to all of the dot-shaped paste patterns (paste applied points) or statistical processing of the results measured by the measuring means with respect to all of the paste applied points except for the paste applied point applied first after the nozzle is exchanged.

At the time when a nozzle is exchanged and the positional displacement of the nozzle discharge port is calculated by applying a very small amount of a paste discharged through a paste discharging port of the nozzle onto a substrate to form a dot-shaped pattern and by reading the position of the dot-shaped paste pattern, the center of the very small amount of the paste discharged through the paste discharging port of the exchanged nozzle seldom agrees with the center of the nozzle discharging port. According to a study conducted by the authors of the present invention, it has been confirmed that by applying a paste on a substrate several times to draw plural dot-shaped patterns separated from one another, the center of the very small amount of the paste discharged through the paste discharging port of the exchanged nozzle gradually comes to agree with the center of the nozzle discharging port.

Based on the above fact, a means for measuring a position of a paste discharging port of a nozzle reads the positions of an arbitrary number of dot-shaped paste patterns separated one another on a substrate, the dot-shaped patterns being formed by the nozzle of a newly exchanged paste reservoir tube filled with the paste. Then, the displacement of the paste discharging port of the exchanged nozzle to a desired position on the substrate is calculated from the measured results measured with respect to the dot-shaped paste patterns. By doing so, an error due to disagreement between the center of the very small amount of the paste discharged through the paste discharging port and the center of the paste discharging port of the nozzle is eliminated, and consequently the positional displacement of the center of the paste discharging port of the nozzle due to the working accuracy or the attaching accuracy of the paste reservoir tube can be determined. Then, by correcting the positional displacement, the paste discharging port of the nozzle to the substrate can be positioned at a desired position and the positional displacement of the nozzle between before and after the nozzle exchange can be eliminated.

The error due to disagreement between the center of the paste pattern and the center of the paste discharging port can be extremely reduced by not using the first data of the dot-shaped patterns. Further, by using the last data of dot-shaped patterns, the displacement of the paste discharging port of the exchanged nozzle can be calculated in a short time using a measured result in which the center of the paste pattern agrees with the center of the paste discharge port of the nozzle without the statistical processing.

In a detailed example, the measuring means forms (applies) a first and a second straight line-shaped paste pattern intersecting each other on a substrate using an exchanged nozzle and measures the central point of the intersecting point of both paste patterns. Then, the calculating means calculates a positional displacement of the paste discharging port due to the nozzle exchange using the measured result obtained by the measuring means.

Particularly, the paste pattern forming means comprises a relative moving means for changing the relative positional relationship between the substrate and the table so that the first paste pattern applied first is longer than the second paste pattern applied next and the long portion of the first paste pattern is the starting portion of drawing when the first and the second straight line-shaped patterns intersecting each other are drawn onto the substrate using the exchanged nozzle.

According to a study conducted by the inventors of the present invention, it has been confirmed that when a paste is applied onto a substrate while keeping the relative moving speed constant and in a direction, the width of the paste pattern becomes nearly the same as the diameter of the nozzle.

Based on the above fact, a first and a second paste pattern intersecting each other are drawn on a substrate using an exchanged nozzle of a new paste reservoir tube filled with a paste after the nozzle is changed, and a position of the central point of the intersecting point of both paste patterns is measured using the measuring means, and the measured position is read as a central position of the paste discharging port of the new nozzle. Then, the displacement of the paste discharging port of the exchanged nozzle to a desired position on the substrate is calculated. Then, by correcting the positional displacement, the paste discharging port of the nozzle to the substrate can be positioned at a desired position and the positional displacement of the nozzle between before and after the nozzle exchange can be eliminated.

Further, when the first and the second straight line-shaped patterns intersecting each other are drawn onto the substrate using the new nozzle after the nozzle is exchanged, the first paste pattern drawn first is drawn so as to become longer than the second paste pattern intersecting the first paste pattern and the long portion of the first paste pattern is the starting portion of drawing. By doing so, the starting portion of drawing is drawn by the small amount of paste discharged out of the paste discharging port of the new nozzle, and accordingly the position of the starting portion of drawing is placed far from the position of the intersecting point of the first and the second paste patterns to be read as a central position of the paste discharging port of the new nozzle. Therefore, in the vicinity of the intersecting point, the central line of the paste pattern agrees with the center of the paste discharging port of the new nozzle, and the central point of the intersecting point of the first and the second paste patterns completely agrees with the center of the paste discharging port.

Further, a paste applicator according to the present invention is characterized by a means for storing information on an evidence of nozzle change, and a means for positioning the substrate at a desired position to the paste discharge port of the new nozzle after exchange of nozzle by measuring the position of the paste discharging port of the nozzle based on the data of the memory means and calculating the positional displacement of the paste discharging port of the nozzle.

At the time when a nozzle is exchanged, the memory means stores information indicating whether the above positional displacement to the new nozzle has been performed or not. By doing so, when a new substrate is mounted, the paste applicator automatically confirms presence or absence of correction of the positional displacement based on the information of the memory means. If it is judged from the information that the correction of the positional displacement has not been performed, the positional relationship between the new nozzle and the substrate is adjusted by determining the positional displacements of the nozzles before and after the nozzle exchange. By performing this operation for each substrate, it is possible to draw a paste pattern starting from the same position on each of the substrates.

BRIEF DESCRIPTION OF THE DRAWINGS

FIG. 7 is a diagram explaining the process of tentatively applying dot-shaped paste patterns on a substrate in FIG. 6.

FIGS. 8(*a*) to (*e*) is a diagram showing the method of determining a positional displacement of a nozzle in FIG. 6.

DETAILED DESCRIPTION OF THE PREFERRED EMBODIMENTS

Figure 1:
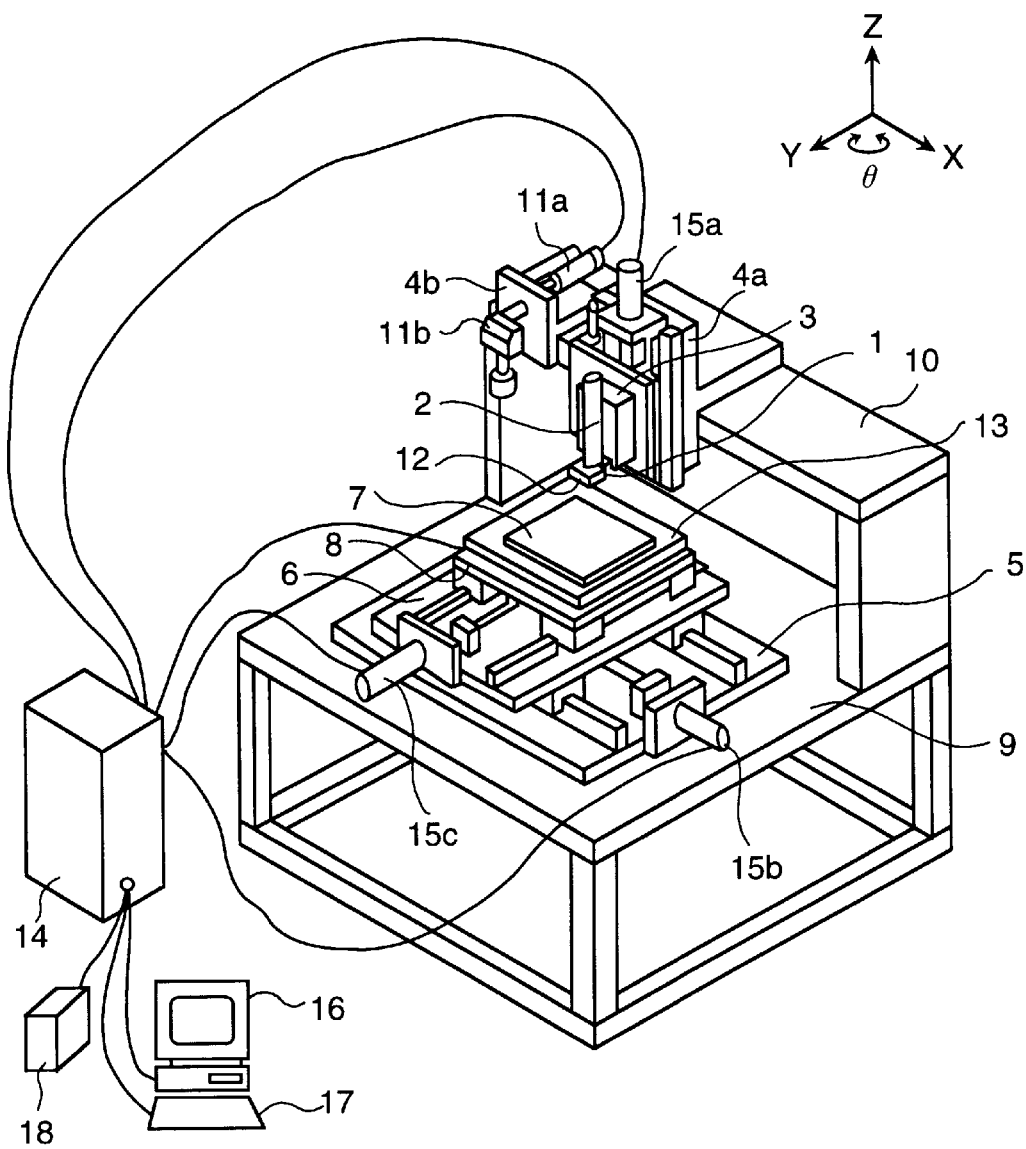
FIG. 1 is a schematic perspective view showing the overall construction of an embodiment of a paste applicator in accordance with the present invention.

FIG. 1 is a schematic perspective view showing the overall construction of an embodiment of a paste applicator in accordance with the present invention. Referring to FIG. 1, the structure of the embodiment of a paste applicator in accordance with the present invention includes a nozzle 1, a paste reservoir tube 2 (hereinafter, referred to as "syringe"), an optical displacement meter 3, a Z-axis table 4a, a camera supporting portion 4b, an X-axis table 5, a Y-axis table 6, a substrate 7, a θ-axis table portion 8, a base mount 9, a Z-axis table support portion 10, an image recognition camera (substrate positioning camera) 11a, a lens barrel 11b, a nozzle support 12, a substrate attracting table 13, a controller 14, a Z-axis motor 15a, an X-axis motor 15b, a Y-axis motor 15c, a monitor 16, a key board 17, and an external memory 18.

In the figure, the X-axis table 5 is fixed on the base mount 9, and the Y-axis table 6 is mounted on the X-axis table 5 movably in the X-axis direction, and the θ-axis table 8 is further mounted on the Y-axis table 6 movably in the Y-axis direction. The substrate attracting table 13 is mounted on the θ-axis table 8, and the substrate 7 is attracted to and mounted on the substrate attracting table 13 in such a manner that the four sides of the substrate are parallel to the X-axis and the Y-axis directions respectively.

The X-axis motor 15b and the Y-axis motor 15c are attached to the X-axis table 5 and the Y-axis table 6, respectively. The X-axis motor 15b and the Y-axis motor 15c are controlled and driven by the controller 14 composed of a micro-computer and so on. That is, when the X-axis motor 15b is driven, the Y-axis table 6 and the θ-axis table 8 and the substrate attracting table 13 are moved in the X-axis direction, and when the Y-axis motor 15c is driven, the θ-axis table 8 and the substrate attracting table 13 are moved in the Y-axis direction. Therefore, by moving the Y-axis table 8 in the X-axis direction and the θ-axis table 8 in the Y-axis direction by arbitrary distances using the controller 14, respectively, the substrate 7 can be moved in an arbitrary direction and to an arbitrary position on a plane parallel to the base mount 9. Further, by moving the θ-axis table 8 using the controller 14, the substrate 7 can be rotated in the θ-axis direction around the Z-axis.

On the surface of the base mount 9, there are mounted the Z-axis table support 10 and the Z-axis table 4a for moving the nozzle support 12 in the Z-direction (vertical directions), the nozzle support 12 connects the nozzle 1 to the syringe 2 and positions the nozzle 1 near lower side of the optical displacement meter 3 serving as a distance meter. In this embodiment, a paste cartridge is composed of the nozzle 1, the syringe 2 and the nozzle support 12 connecting them. Movement of the Z-axis table 4a is performed with the Z-axis motor 15a connected to the Z-axis table 4a which is controlled by the controller 14.

By applying pressure inside the syringe 2 while the Y-axis table 6 and the θ-axis table 8 are being driven in the X-axis direction and the Y-axis direction, respectively, a paste is discharged onto the substrate 7 through the paste discharging port of the nozzle 1 to draw a paste pattern on the substrate 7.

Data for instructing a shape of a paste pattern to be drawn on the substrate 7 and data for instructing a desired distance between the paste discharging port of the nozzle 1 and the surface of the substrate 7 are input from the key board 17. The external memory 18 composed of a hard disk drive and so on is for storing various kinds of setting values to be stored in an RAM of a micro-computer in the controller 14 at starting-up the paste applicator.

The image recognizing camera 11a having the lens barrel 11b is attached to the camera support portion 4b to be used for recognizing a position of the substrate 7 at setting an initial position of the substrate 7. Such image data is input to the controller 14 to be used for controlling various parts. The image and the input data from the key board 17 are displayed on the screen of the monitor 16.

Figure 2:
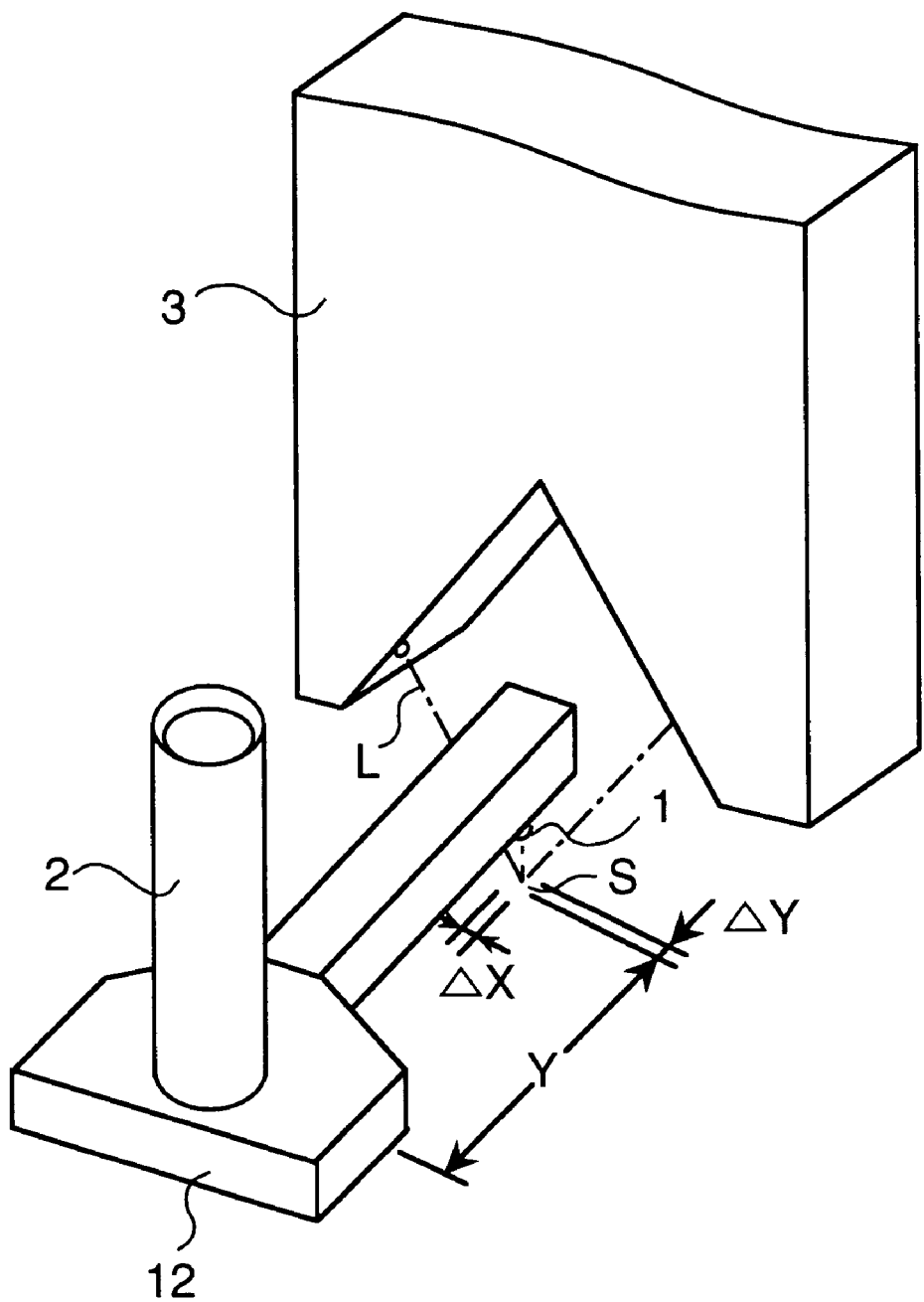
FIG. 2 is a perspective view showing the relationship between a paste reservoir tube and an optical displacement meter shown in FIG. 1.

FIG. 2 is an enlarged perspective view showing the portion of the syringe 2 shown in FIG. 1. Therein, corresponding parts in the figure to FIG. 1 are indicated by the same reference characters.

In the figure, a triangular cut-portion is formed in the lower end of the optical displacement meter 3, and a light-producing element and a light-receiving element are provided in the cut-portion. A nozzle support 12 extending to the lower portion of the cut-portion of the optical displacement meter 3 is provided in the lower end of the syringe 2, and the nozzle 1 is attached onto the lower surface of the end the nozzle support 12 in such as to position under the cut-portion of the optical displacement meter 3.

The optical displacement meter 3 measures a distance between the top end of the nozzle 1 and the surface of the substrate 7 through a non-contact triangulating method. That is, a laser beam L emitted from a light producing element of the optical displacement meter 3 is reflected at a measuring point S on the substrate 7 and received by the light receiving element of the optical displacement meter 3. In this case, the light producing element and the light receiving element are provided on the different side surfaces of the cut-portion so that the laser beam L is not interrupted by the nozzle support 12, and accordingly the laser beam L is emitted in a slanting direction and reflected in a slanting direction.

Therein, although the measuring point S by the laser beam L and the position right under the nozzle 1 are slightly displaced on the substrate 7 by ΔX and ΔY, the optical displacement meter 3 can nearly accurately measure the distance between the top end of the nozzle 1 and the surface of the substrate 7 right under the nozzle within such a degree of displacement because there is little difference in the levels of the surface of the substrate 7 between at the measuring point S on the substrate 7 and at the position right under the top end of the nozzle 1.

Even if there is an undulation on the surface of the substrate 7, the controller 14 in FIG. 1 operates the Z-axis table 4a upward and downward based on the measured result of the optical displacement meter 3 during applying a paste onto the substrate. By doing so, the paste discharging port of the nozzle 1 is controlled so as to maintain a desired distance from the surface of the substrate 7, and width and thickness of the applied paste, therefore, become uniform all over the paste pattern.

In order to avoid the measuring point S from crossing over a paste pattern having been already applied on the substrate 7, the measuring point S is set so as to be positioned in a slanting direction with regard to both the X-axis and the Y-axis from a drop point of the paste discharged through the paste discharging port of the nozzle 1.

Figure 3:
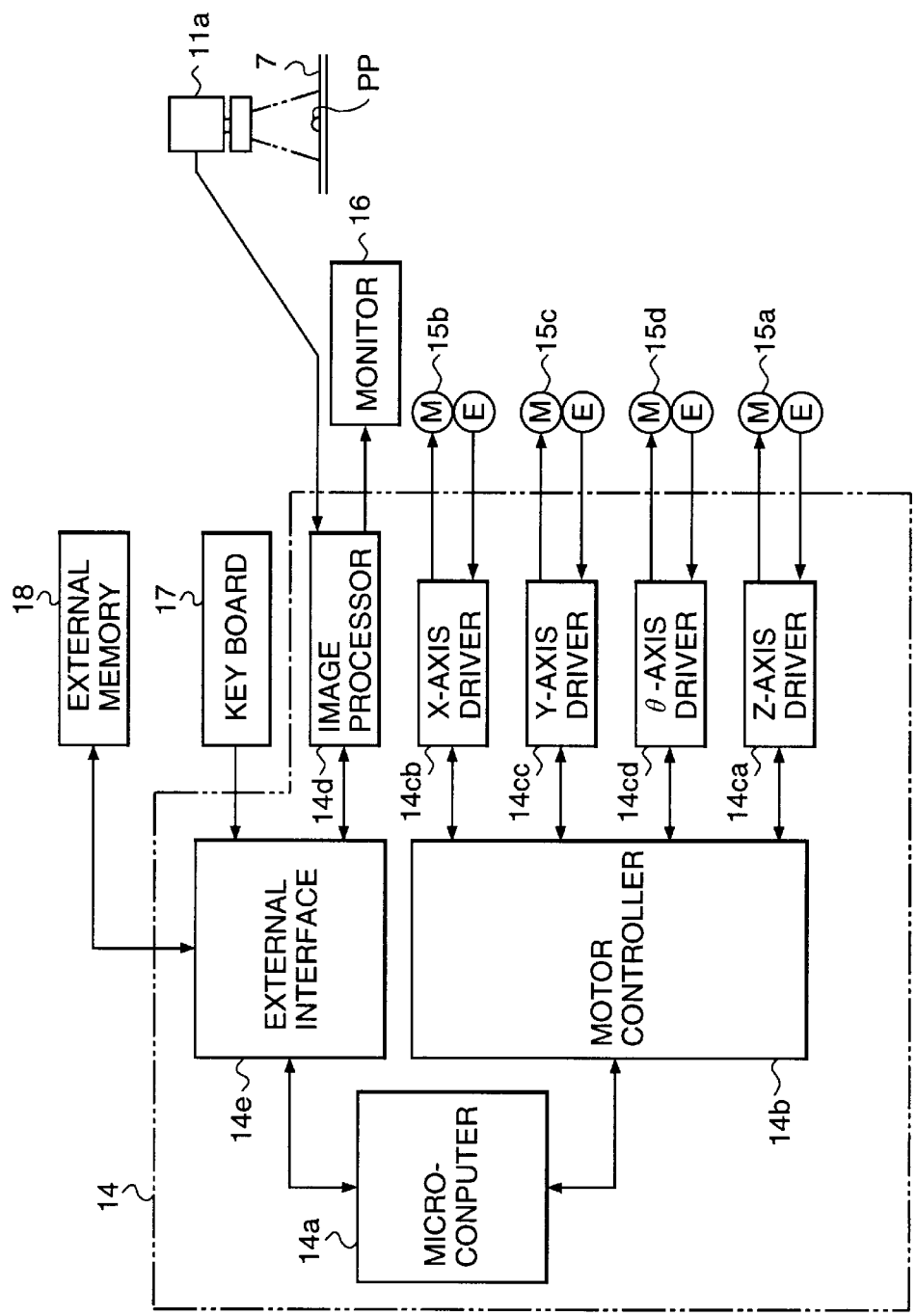
FIG. 3 is a block diagram showing an embodiment of a controller shown in FIG. 1.

FIG. 3 is a block diagram showing an embodiment of a controller 14 shown in FIG. 1. The controller 14 includes a micro-computer 14a, an external interface 14e, a motor controller 14b, an X-axis driver 14cb, a Y-axis driver 14cc, a θ-axis driver 14cd, a Z-axis driver 14ca, an image processor 14d. The reference character 15d in FIG. 3 shows a θ-axis motor, each E shows an encoder and PP shows a paste pattern. Therein, corresponding parts in the figure to FIG. 1 are indicated by the same reference characters.

In the figure, the micro-computer 14a comprises a main processor, a ROM for storing a program of software processing for drawing paste patterns PP to be described later, a RAM for storing a result processed by the main processor and input data from an external interface 14e and a motor controller 14b, and an input/output unit for exchanging data between the external interface 14e and the motor controller 14b.

Inputs to the key board 17 are data to specify a desired shape of a paste pattern to be drawn and data to specify a desired distance between the nozzle 1 and the substrate 7 which are supplied to the micro-computer 14a through the external interface 14e. In the micro-computer 14a, the data is processed according to a software program stored in the ROM using the main processor and the RAM.

According to the data to specify a desired shape of a paste pattern processed in such a manner, the motor controller 14b is controlled, and the X-axis motor 15b, the Y-axis motor 15c or the θ-axis motor 15d is driven to be rotated by an X-axis driver 14cb, a Y-axis driver 14cc or a θ-axis driver 14cd. Encoders E are provided in the rotating shafts of these motors, and a rotating amount (drive operating amount) of each of the motors is detected to be fed back to the micro-computer 14a through the X-axis driver 14cb, the Y-axis driver 14cc or the θ-axis driver 14cd and the motor controller 14b. The micro-computer 14a controls the X-axis motor 15b, the Y-axis motor 15c or the θ-axis motor 15d so as to be accurately rotated by the specified amount of rotation. By doing so, the desired paste pattern can be drawn on the substrate 7.

Data measured by the optical displacement meter 3 during drawing a paste pattern is converted to digital data using an A-D converter which is not shown in the figure, and supplied to the micro-computer 14a through the external interface 14e to perform comparing processing with the aforementioned data specifying the distance between the nozzle 1 and the substrate 7. When an undulation exists on the surface of the substrate 7, the microcomputer 14a detects the undulation based on input data and controls the motor controller 14b to drive and rotate the Z-axis motor 15a by the Z-axis driver 14ca. Thus, the Z-axis table 4a (FIG. 1) is moved vertically so as to maintain the distance between the paste discharging port of the nozzle 1 (FIG. 2) and the surface of the substrate 7 constant. An encoder E is also provided in the Z-axis motor 15a, and the detected rotating amount of the Z-axis motor 15a is fed back to the micro-computer 14a. Therefore, the micro-computer 14a controls the Z-axis motor 15a so as to be accurately rotated by the specified amount of rotation.

The build-in RAM of the micro-computer 14a stores data for paste drawing patterns, data at exchanging the paste reservoir tube, various kinds of data input from the key board 17 and various data processed and produced by the micro-computer 14a.

Operation of application of paste for drawing patterns and exchange of the paste reservoir tube will be described below.

Figure 4:
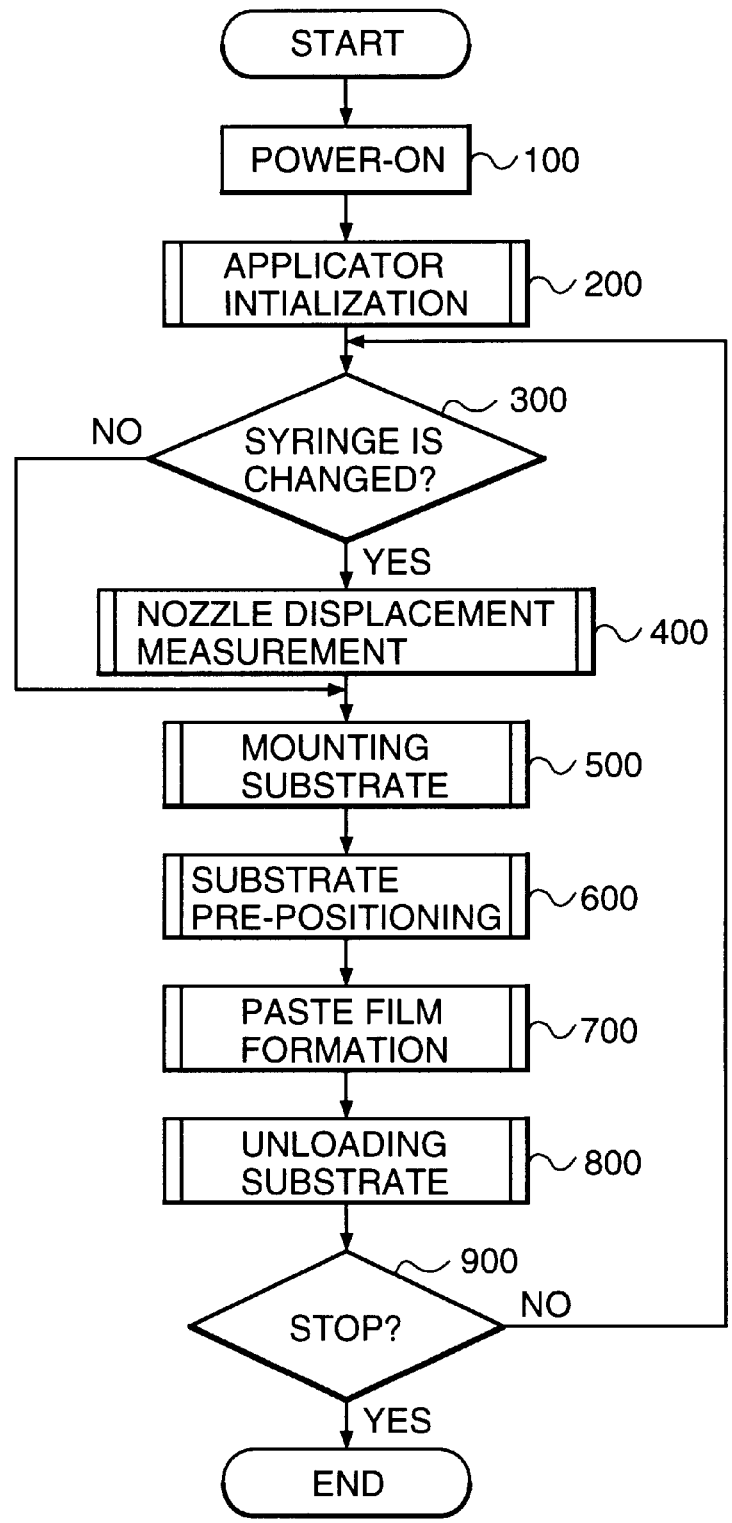
FIG. 4 is a flow chart showing the operation of applying paste in the embodiment of FIG. 1.

In FIG. 4, power is switched on (Step 100), and initialization of the applicator is executed (Step 200).

Figure 5:
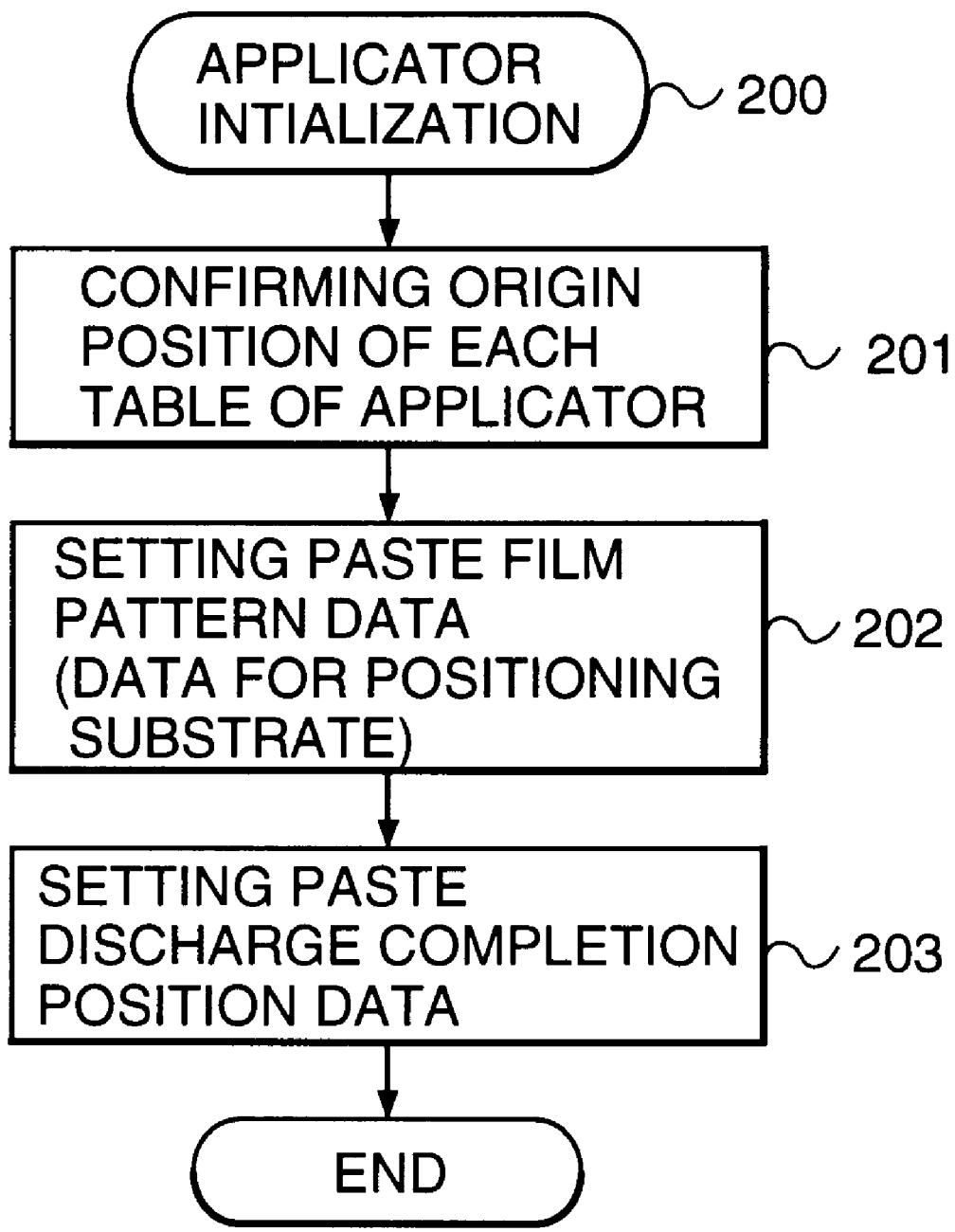
FIG. 5 is a flow chart showing an embodiment of application initializing process in FIG. 4.

The initialization is executed in a process as shown in FIG. 5.

That is, initially the Z-axis table 4a, the X-axis table 5 and the Y-axis table 6 are positioned at positions of the given origins (Step 201), and then paste film pattern data, substrate position data and paste discharge completion position data are set (Steps 202, 203). The data for setting is input from the key board 17 of FIG. 1. The input data is stored in the build-in RAM of the micro-computer 14a in the controller 14, as described above.

The pattern data for paste film is data with regard to a pattern, so-called, drawn with a single brush stroke, a dot-shaped pattern drawn by applying paste in a dot-shape having a size near the diameter of the nozzle 1, and expresses a pattern to be drawn on the substrate 7 as positional data on a drawing plane of the substrate 7.

Referring to FIG. 4, it is confirmed and judged whether exchange of the syringe 2 (nozzle exchange) has been executed or not (Step 300) (The exchange of the syringe 2 will be described in paste film forming process (Step 700) of FIG. 10 in detail). If the exchange of syringe 2 has been executed, displacement of the nozzle position is measured (Step 400) and a substrate is mounted (Step 500). If the exchange of the syringe 2 has not executed, a substrate is mounted (Step 500).

Here, the nozzle position displacement process (Step 400) when exchange of syringe has been executed will be described in detail below, referring to FIG. 1 and FIG. 6.

Initially, a temporary substrate is mounted on the substrate attracting table 13 of FIG. 1 (Step 401) and attracted to be held to the substrate attracting table 13 (Step 402), and the temporary substrate is moved so that a portion of the temporary substrate right under the center of a view of the image recognizing camera 11a comes to the position right under the nozzle 1 (Step 403). Then, the nozzle 1 is moved downward using the Z-axis table 4a (Step 404), and dot-drawing is executed by applying a paste filled in the syringe 2 onto the temporary substrate to form a dot-shaped film (Step 405). After that, the nozzle 1 is moved upward (Step 406). The series of the operations from Step 404 to Step 406 are repeated by a pre-set number times.

When it is confirmed that the dot-drawing has been repeated by the preset number times (Step 407), the temporary substrate is moved to a position right under the view center of the image recognizing camera 11a (Step 408). Then, the position of the dot-shaped paste is measured using the image recognizing camera 11a (Step 409). The position measurement is executed in each operation of drawing dot-shaped pattern for all of the dot-shaped paste patterns (Step 410) and the measured data is stored in the RAM in the micro-computer 14a.

FIG. 7 is a diagram explaining the process of the applying dot-shaped paste patterns described above, and shows a feature on the temporary substrate seeing with the image recognizing camera 11a. Therein, the number of forming dot-shaped patterns is five, and these dot-shaped paste patterns are shown by P1 to P5.

Figure 6:
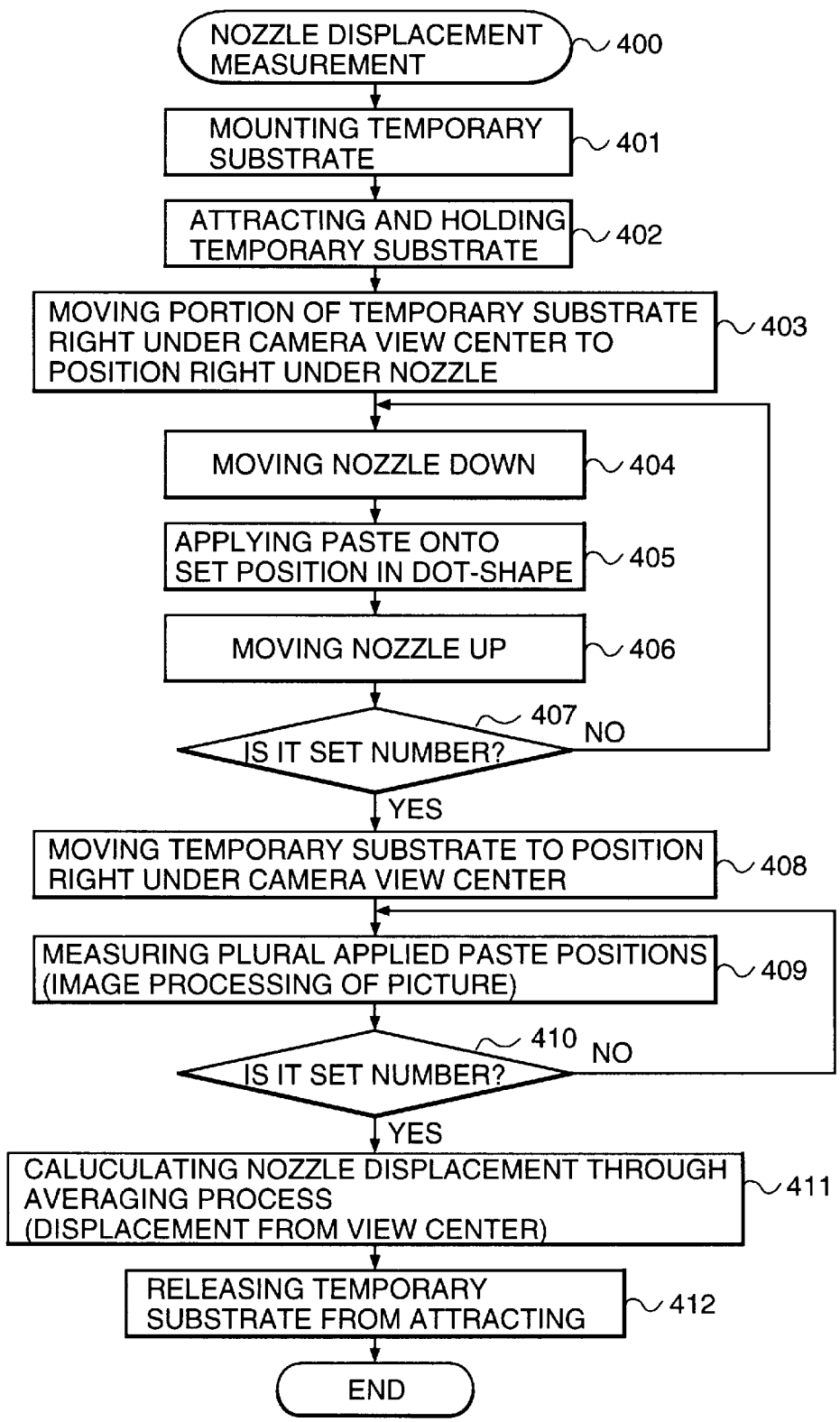
FIG. 6 is a flow chart showing an embodiment of nozzle displacement measuring process in FIG. 4.

In FIG. 1, FIG. 6 and FIG. 7, the operation of drawing dot-shaped paste patterns P1 to P5 is executed by applying the paste on the temporary substrate in arranging the dot-shaped paste pattern P1 in the center and the others equally spaced from the dot-shaped paste pattern P1 by DX and DY in the X-axis and the Y-axis directions so as to not overlap with one another by moving the Y-axis table 6 in the X-axis direction and the θ-axis table 8 in the Y-axis direction (Step 405). The frame G shown by dotted line indicates the view of the image recognizing camera 11a, and the distances DX and DY are selected so that all the dot-shaped paste patterns P1 to P5 come within the view G.

Distance X in FIG. 7 indicates a moving distance of the Y-axis table 6 in the X-axis direction from the view center P0 of the image recognizing camera 11a before starting of moving in Step 408. The moving distance X is a predetermined distance from the view center P0 to a position right under the top end of the nozzle without displacement. Therefore, when the Y-axis table 6 is moved by the distance X, the center of the first applied dot-shaped paste pattern P1 must agree with the center of the view G of the image recognizing camera 11a. Further, the distances between the centers of the dot-shaped paste patterns P2 to P5 and the center of the first applied dot-shaped paste pattern P1 must be DX and DY. However, actually, the distances are displaced.

The displacement contains working accuracy of the paste reservoir tube 2 and the nozzle 1, the deviation in the assembling accuracy of the paste reservoir tube 2 and the nozzle 1 and the disagreement between the center of the nozzle and the center of the small amount of the paste discharged from the paste discharging port of the nozzle at the time when the nozzle is exchanged. One of the causes of the disagreement comes from cleaning at the time when the nozzle is exchanged. If the paste discharging port of the nozzle is carefully cleaned, it takes an unnecessarily long time to exchange the nozzle and workability is degraded. This embodiment is to solve the displacement due to the latter cause by the method to be described as follows.

Each picture of the dot-shaped paste patterns P1 to P5 is taken by the image recognizing camera 11a, and the image data is executed by well-known image processing using the image processor 14d (FIG. 3) to determine the center of gravity of each of the dot-shaped paste patterns, that is, the position of the center of the dot-shaped paste patterns P1 to P5.

FIGS. 8(a) to (e) show image processed results of the positions of the center of the dot-shaped paste patterns P1 to P5. Therein, the solid lines indicate contours of the image-processed dot-shaped paste patterns P1 to P5.

Since the picture of the dot-shaped paste patterns P1 to P5 and the picture of the nozzle cannot be taken at a time using the image recognizing camera 11a, the contour of the nozzle 1 is virtually indicated by a dash-dot line in comparing to the dot-shaped paste patterns P1 to P5. ΔX1 to ΔX5, ΔY1 to ΔY5 indicate displacements between the center of the dot-shaped paste patterns P1 to P5 and the center of the nozzle 1 including the displacement due to variation of work accuracy in the paste discharge tube 2 and the nozzle 1 and assembling accuracy of the paste discharge tube 2 and the nozzle 1. The figure shows that as the number of applying the paste increases, the displacement ΔX1, ΔY1 gradually decreases to ΔX2, ΔY2, . . . , ΔX5, ΔY5.

Next, an amount of displacement (deviation) between the nozzle 1 and the center of the view G is calculated using the following equations. The deviation is stored in the RAM of the micro-computer 14a as the amount of displacement of the nozzle since the deviation is to be used later (Step 411).

$$X_{mean} = \frac{\sum_{i=1}^{n} \Delta X_i}{n}$$

$$Y_{mean} = \frac{\sum_{i=1}^{n} \Delta Y_i}{n}$$

Where i is number of applying order of the dot-shaped paste patterns P1 to P5, and mean indicates a mean value (averaged value).

Finally, the temporary substrate is released from attracting (Step 412) and thus the nozzle displacement measurement process (Step 400) is completed.

Although the number n of applying order of the dot-shaped paste patterns in this embodiment is 5 and the error comes to smaller value when the number n of applying order of the dot-shaped paste patterns is larger, the number n of applying order of the dot-shaped paste patterns may be arbitrarily set in taking the processing time required for the series of operations of Step 404 to Step 411 into consideration.

Referring to FIG. 4, in Step 500, a substrate 7, on which paste is to be applied for drawing a desired pattern thereon, is mounted on and attracted to the substrate attracting table 13 (FIG. 1), and substrate pre-positioning process is performed (Step 600).

Figure 9:
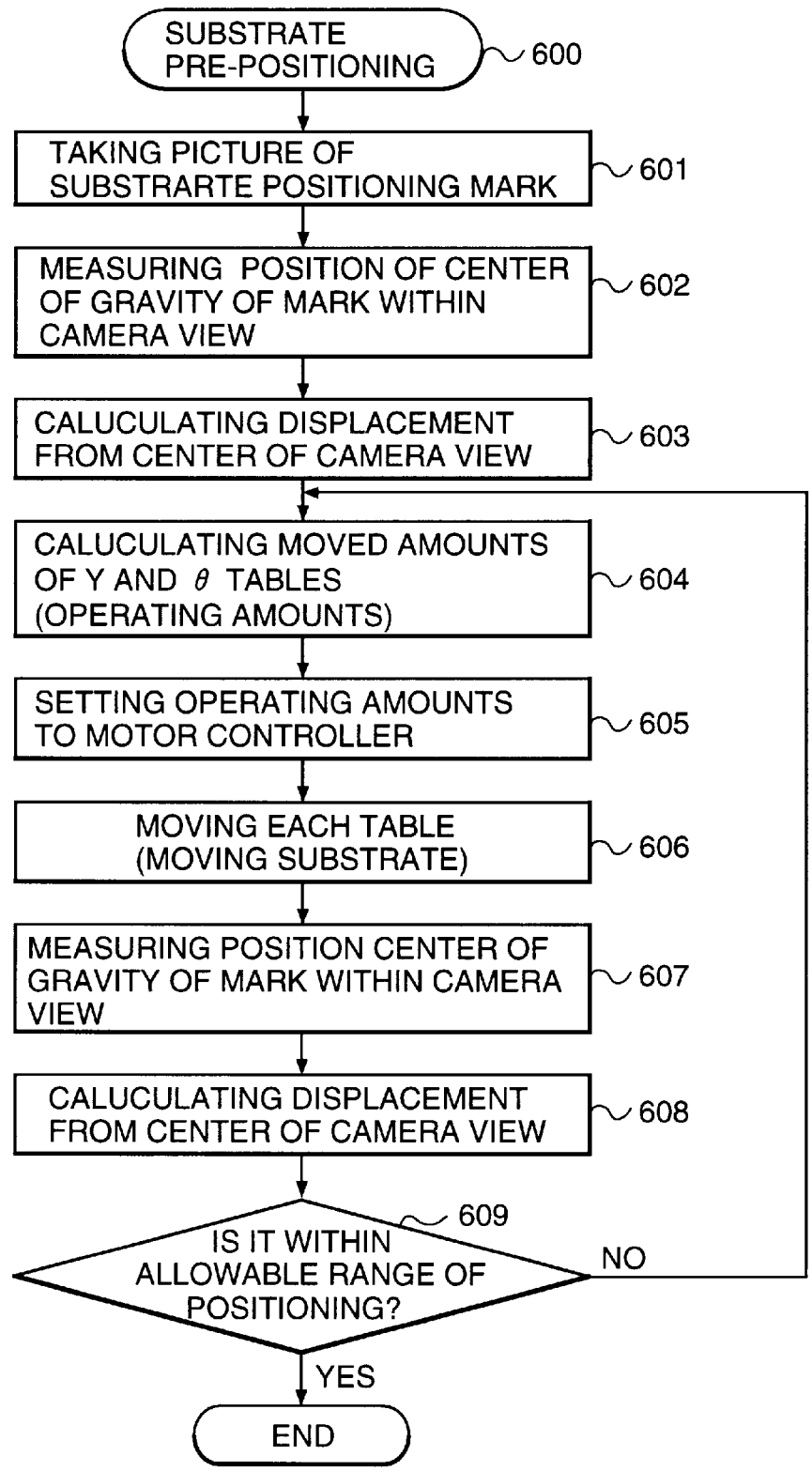
FIG. 9 is a flow chart showing an embodiment of substrate pre-positioning process in FIG. 4.

FIG. 9 is a flow chart showing an embodiment of the substrate pre-positioning process in Step 600.

In the figure, initially, picture of a mark for positioning the substrate 7 mounted on the substrate attracting table 13 is taken by the image recognizing camera 11a (Step 601), and the position of the center of gravity of the mark for positioning the substrate within the view of the image recognizing camera 11a is determined through image processing (Step 602). Then, the displacement between the center of view and the center of gravity is calculated (Step 603), and in order to set the substrate 7 to a desired position for starting application, moving amount of the Y-axis table 6 in the X-axis direction, moving amount of the eaxis table 8 in the Y-axis direction and moving amount of the θ-axis table 8 in the θ-axis direction are calculated using the displacement (Step 604), and further, these amounts are converted to operating amounts of the servo-motors 15b to 15d, 15a using the motor controller 14b (FIG. 3) (Step 605), and then the substrate 7 is set to the desired position by moving the tables 6, 8 in the X-axis and Y-axis directions and the θ-direction (Step 606).

In order to confirm that the substrate 7 is set to the desired position, the mark for positioning the substrate 7 is again taken by the image recognizing camera 11a and the center (center of gravity) of the mark for positioning within the view is measured (Step 607), and the displacement of the center of the mark within the view is obtained (Step 608) to judge whether or not the displacement is within an allowable range (Step 609). If the displacement is within the allowable range, the substrate pre-positioning process (Step 600) is completed. If not, the processing is returned to Step 604 and the above process is repeated.

When the substrate pre-positioning process (Step 600) is completed, the processing proceeds to the paste film formation process in FIG. 4 (Step 700).

Figure 10:
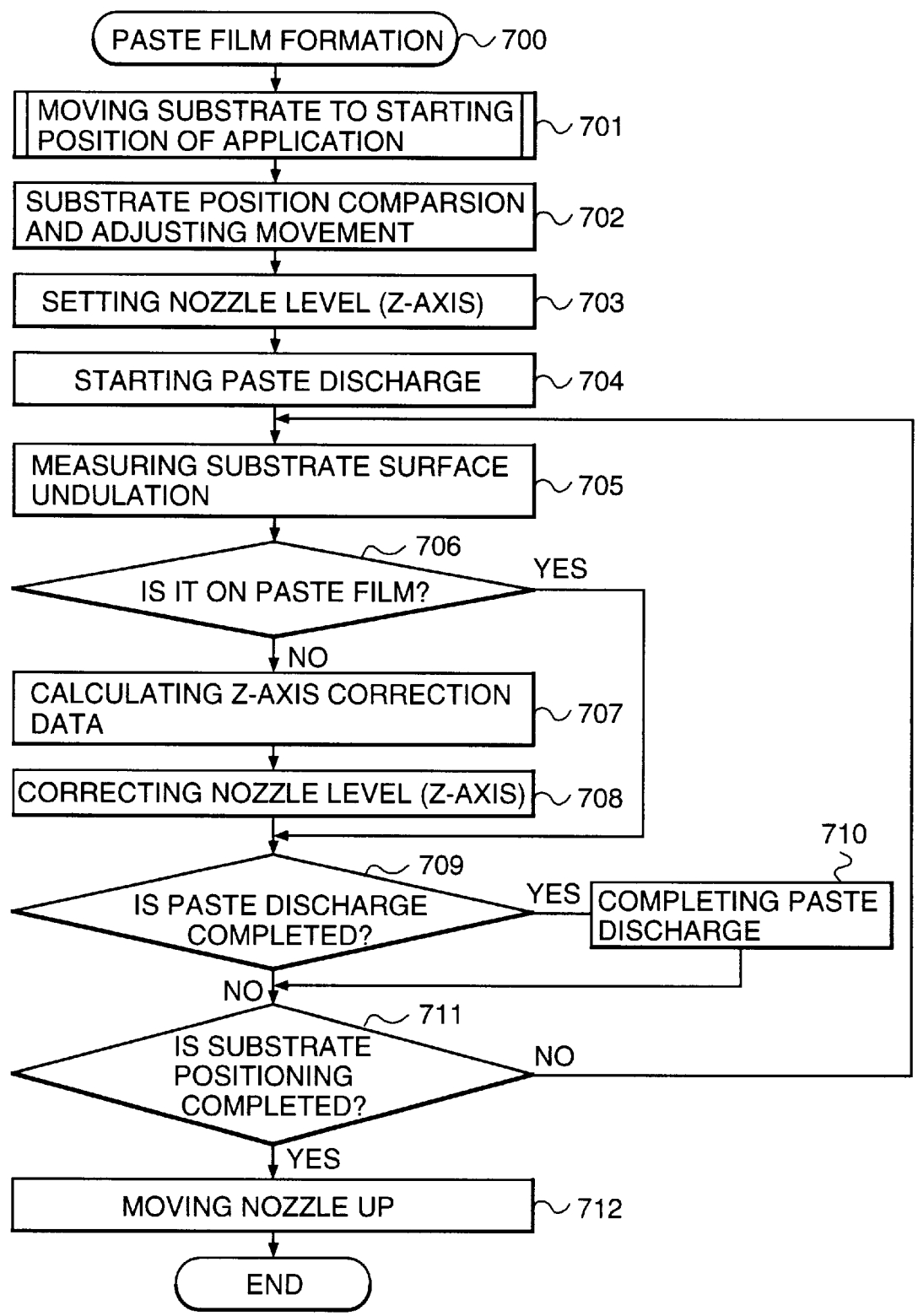
FIG. 10 is a flow chart showing an embodiment of paste film forming process in FIG. 4.

FIG. 10 is a flow chart showing an embodiment of the paste film formation process.

In the figure, initially, the substrate 7 is moved to a starting position of application (Step 701) and comparison and adjusting movement of the substrate is performed (Step 702). This process is based on the displacement measurement process (Step 400) for the nozzle 1 described above, as shown in FIG. 6 and FIG. 7. The process will be described below, referring to FIG. 11.

Initially, it is judged whether or not the amounts of positional displacement Xmean, Ymean of the nozzle 1 (FIG. 1) determined in Step 409 of FIG. 6 and stored in the RAM of the micro-computer 14a (FIG. 3) are within an allowable range ΔX, ΔY (Step 702a). If the amounts of displacement are within the allowable range (ΔX≧Xmean, ΔY≧Ymean), the processing directly proceeds to the next process in FIG. 10, that is, the nozzle level setting process (Step 703).

Figure 11:
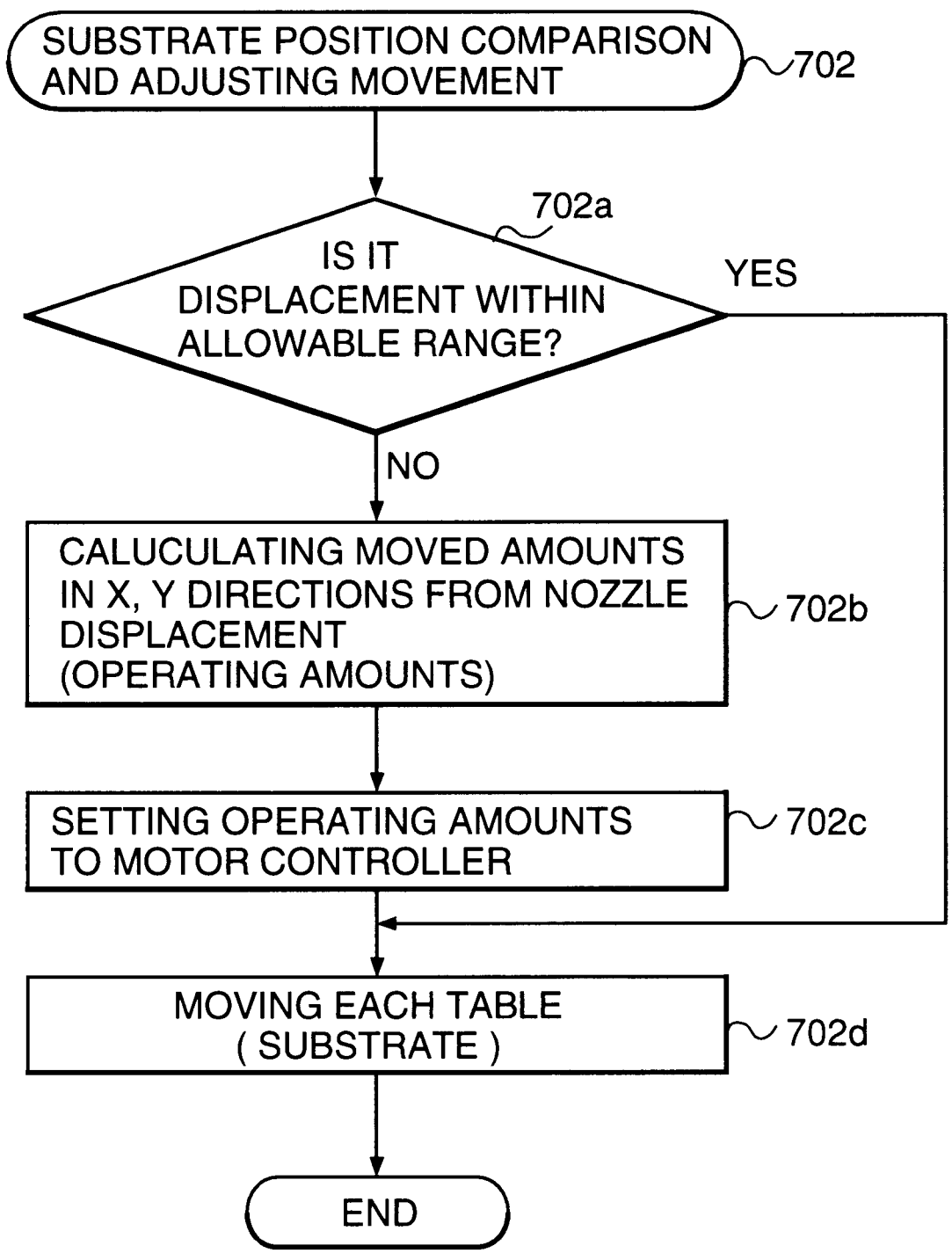
FIG. 11 is a flow chart showing an embodiment of substrate position comparison and adjusting movement process in FIG. 10.

If the amounts of displacement exceed the allowable range ($\Delta X<X$mean, $\Delta Y<Y$mean), in FIG. 11, moving amounts of the Y-axis and the θ-axis tables 6, 8 in the X-axis and Y-axis directions are calculated from the aforementioned positional displacements Xmean and Ymean (Step 702b), and operating amounts are input to the motor controller 14b (FIG. 3) (Step 702c). Then, the servo-motors 15b, 15c are rotated through the X-axis and the Y-axis drivers 14cb, 14cc by specified amounts, respectively, and the Y-axis and the θ-axis tables 6, 8 are moved in the X-axis and the Y-axis directions to set the substrate 7 at the desired position by eliminating the displacement between the paste discharging port of the nozzle 1 and the desired position on the substrate 7 which is caused by exchanging the nozzle 1 (Step 702d). Thus, the process of Step 702 in FIG. 10 is completed.

In FIG. 10, after completion of process Step 702, the level of the nozzle 1 is set (Step 703). Therein, the gap between the paste discharging port of the nozzle 1 and the surface of the substrate becomes the thickness of applied paste. Since the substrate 7 is set at the desired position by the substrate pre-positioning process (Step 600) in FIG. 9 and the substrate position comparison and adjusting movement process in FIG. 11 (Step 702) as described above, after completion of setting the level of the nozzle 1, the paste is discharged to start the operation of drawing (Step 704).

At the same time, undulation of the surface of the substrate 7 is measured using measured data output from the optical displacement meter 3 (Step 705), and it is judged from the measured data of the optical displacement meter 3 whether the measuring point S (FIG. 2) of the optical displacement meter 3 is on a paste film or not (Step 706). Since the measuring data of the optical displacement meter 3 abruptly changes to an allowable value when the measuring point S of the optical displacement meter 3 passes across a paste film, this judgement is performed by detecting that the measured data from the optical displacement meter 3 abruptly changes to exceed the allowable value.

When the measuring point S of the optical displacement meter 3 is not on a paste film, correcting data for moving the Z-axis table 4a corresponding to undulation of the surface of the substrate 7 is calculated based on the measured data (Step 707). Level of the nozzle 1 is corrected using the Z-axis table 4a to maintain the position of the nozzle 1 in the Z-axis direction at a preset value (Step 708).

When it is judged that the measuring point S of the optical displacement meter 3 passes across a paste film (Step 706), the paste is discharged to form the film while the level of the nozzle 1 is not changed and held as it is. This is because since in most cases there is no change on the surface of the substrate 7 while the measuring point S of the optical displacement meter 3 passes across a very small width of a paste film, there is no change in shape of the discharged paste and,therefore, a desired paste film can be drawn if the level of the nozzle 1 is not changed. When it is measured that the measuring point S has passed through the paste film, the processing is returned to the original process of nozzle level correction.

The drawing operation is further progressed, it is judged whether the paste discharging is completed or not based on whether the preset pattern operation is completed or not (Steps 709, 710). The judgement of whether the paste film forming is completed or not is executed by whether the substrate 7 reaches to a position corresponding to a final terminal end of the preset pattern (Step 711). If the substrate 7 does not reach to a position corresponding to a final terminal end yet, the series of the above processes from Step 705 are repeated. In such a manner, the paste film forming is continued until the paste film forming reaches to the final terminal end of the pattern. When the paste film forming reaches to the final terminal end of the pattern, the nozzle 1 is moved upward (Step 712) by driving the Z-axis table 4a to complete the paste film forming process (Step 700).

After completion of the paste film forming process, in FIG. 4, the substrate 7, on which the paste drawing is completed, is unloaded from the substrate attracting table 13 (Step 800), and it is judged whether the whole process is stopped or not (Step 900). That is, when the same pattern of the paste film is formed on a plurality of substrates, the series of the operation from the syringe exchange judging process (Step 300) to the substrate unloading process (Step 800) is repeated as many times as the number of the substrates.

In stop judging process (Step 900), whether or not the paste in the paste reservoir tube (syringe) 2 remains sufficiently is judged through, for example, confirmation of an operator or judgement of the micro-computer 14a using accumulated amount of discharged paste after exchange of the nozzle. If the remaining paste is little, the syringe 2 is changed at that time, and information that the nozzle has been exchanged is input from the key board 17 and the information, for example, a flag is stored in the RAM in the micro-computer 14a. By doing so, when the syringe exchange judgement process (Step 300) is executed after that time, the processing can automatically proceed to the next step of the nozzle displacement measurement process (Step 400) by confirming presence or absence of the flag in a data table with regard to syringe exchange in the RAM.

After confirming presence or absence of the flag in a data table with regard to syringe exchange in the RAM and automatically proceeding to the next step of the nozzle displacement measurement process (Step 400) to measure a displacement, the flag is eliminated. Therefore, the nozzle displacement measurement process (Step 400) is not executed unnecessary until the next nozzle exchange is performed.

In a case where shortage of the paste in the syringe 2 occurs in the midway of the paste film formation process (Step 700) in FIG. 10 and the nozzle is changed, if there is no obstacle in that the processing proceeds to the substrate unloading process (Step 800) at that time or the paste application onto the substrate is continued just as it is without nozzle exchange, the syringe exchange judgement process (Step 300) and the nozzle displacement measurement process (Step 400) in FIG. 4 may be performed before re-started of the paste film formation process (Step 700).

In FIG. 11, when the amounts of positional displacement of the nozzle 1 Xmean and Ymean exceed the displacement allowable range $\Delta X$, $\Delta Y$ of the nozzle 1 shown in FIG. 2, the substrate 7 is moved. However, the camera support portion 4a may be constructed so as to move and adjust in the X-axis and the Y-axis directions to the Z-axis table support portion 10 and the amounts of positional displacement of the nozzle 1 Xmean and Ymean may be brought within the displacement allowable range $\Delta X$, $\Delta Y$ by moving the image recognizing camera 11a instead of moving the substrate 7.

Since the data $\Delta X1$, $\Delta Y1$ for the first dot-shaped paste pattern described in FIG. 7 and FIG. 8 includes a large error, the amounts of positional displacement of the nozzle 1 Xmean and Ymean in Step 411 of FIG. 6 may be calculated based on the data $\Delta X2$, $\Delta Y2$ and the following without using the data $\Delta X1$, $\Delta Y1$ for the first dot-shaped paste pattern. Further, the displacement $\Delta Xi$, $\Delta Yi$ for each of the dot-shaped paste patterns converges to the last dot-shaped paste pattern, as described above, the data $\Delta Xn$, $\Delta Yn$ for the last dot-shaped paste pattern may be used for the amounts of positional displacement of the nozzle 1 instead of using the result of the statistical process (averaging process).

Another embodiment of the nozzle displacement measurement process (Step 400) of FIG. 4 will be described below, referring to FIG. 12.

Figure 12:
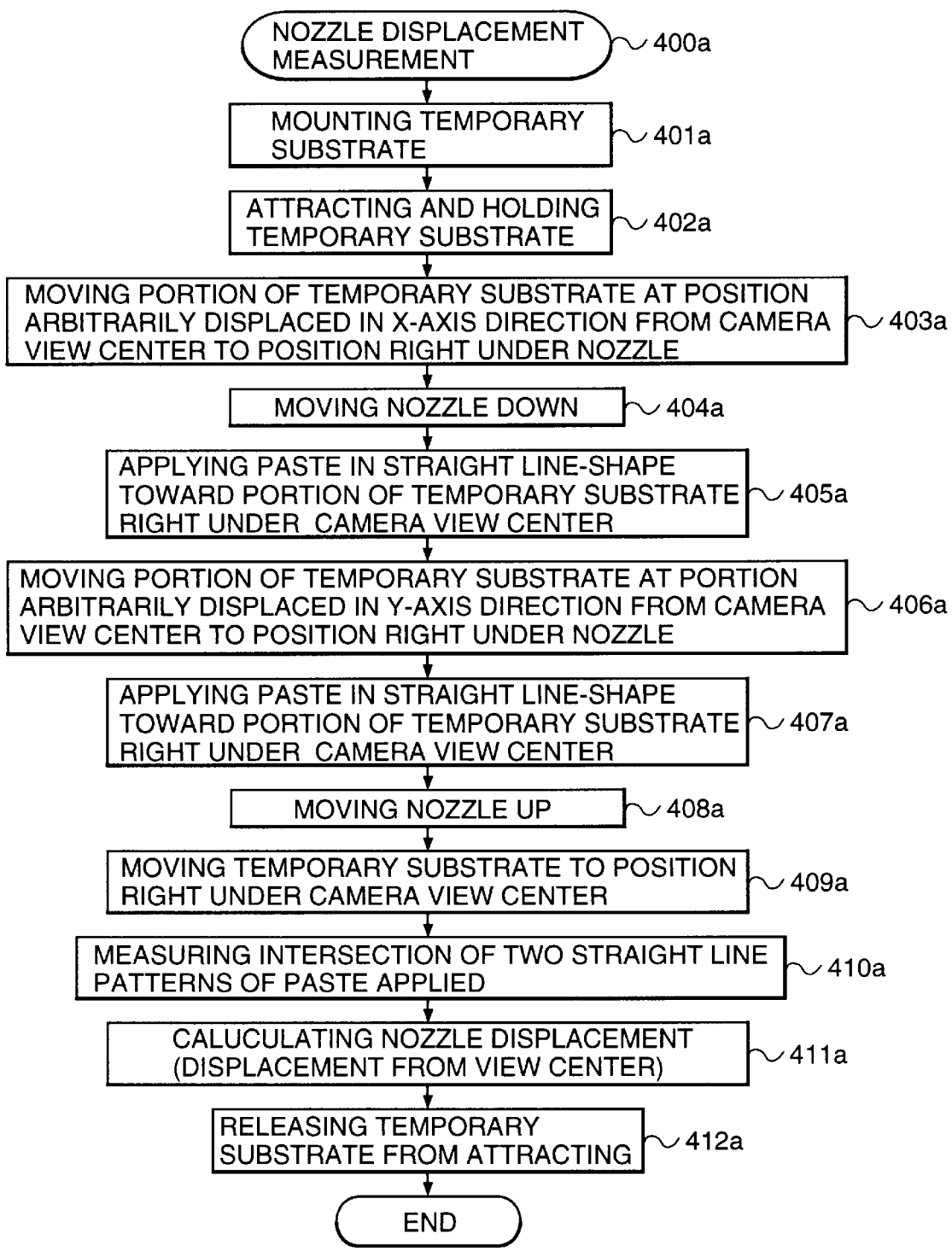
FIG. 12 is a flow chart showing another embodiment of nozzle positional displacement measuring process in FIG. 4.

In order to distinguish each step in FIG. 12 from each of the steps 401 to 412 of the nozzle displacement measurement process (Step 400) of FIG. 6, the reference character for each of the steps in FIG. 12 is attached with subscript "a".

Figure 13A:
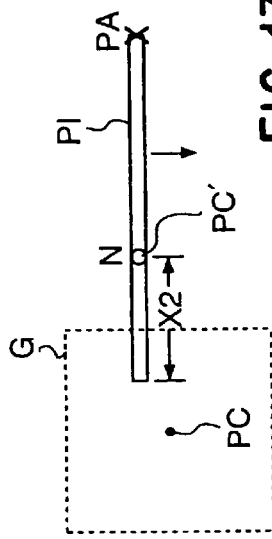
FIGS. 13(*a*) to (*f*) is a diagram showing the operation of drawing two straight line-shaped paste patterns intersecting each other in FIG. 12.
Figure 13B:
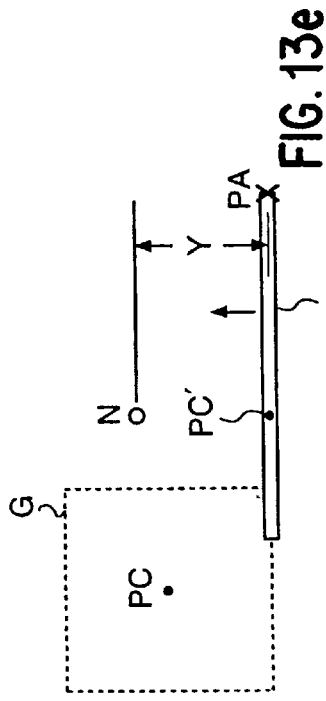

In FIG. 12, initially, a temporary substrate is mounted on the substrate attracting table 13 (Step 401a) and attracted to be held to the substrate attracting table 13 (Step 402a). Then, a position of a temporary substrate is set so that a view G of the image recognizing camera 11a comes to the temporary substrate (this state is shown by FIG. 13(a)), and a portion PA of the temporary substrate at a position arbitrarily displaced in the X-axis direction by a distance X1 from the center point PC of the view G is moved to a position N right under the nozzle 1, as shown in FIG. 13(b) (Step 403a). There, P0 is a position on the temporary substrate corresponding to the center point PC of the view G of the image recognizing camera 11a under the state shown in FIG. 13(a) and is moved together with the movement of the temporary substrate described above. When the temporary substrate is positioned at the position right under the nozzle 1 as shown in FIG. 13(b), the portion having existed at the center point PC of the view on the temporary substrate in the state of FIG. 13(a) is shown as the position P0.

Figure 13C:
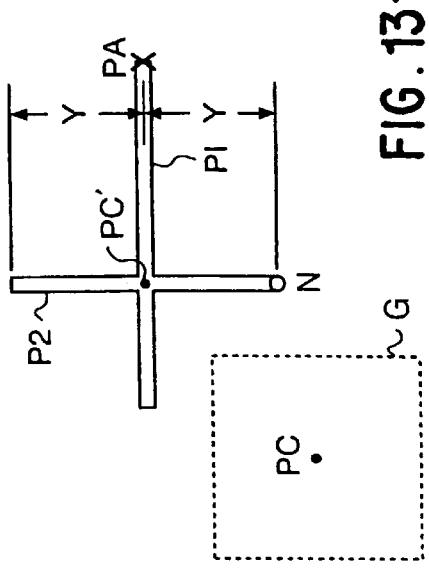

Then, the nozzle 1 is moved downward using the Z-axis motor 15a (Step 404a), and a straight-line-shaped paste pattern P1 extending in the X-axis direction as shown by FIG. 13(c) is formed by applying a paste filled in the paste discharging tube 2 onto the temporary substrate and at the same time by moving the temporary substrate in the direction opposite to the center PC of the view of the image recognizing camera 11a by a given distance X using the X-axis motor 15b (Step 405a).

Although the distance X, here, is set to a length longer than the length in the X-axis direction of the view G of the image recognizing camera 11a, it is not always necessary to do so.

Figure 13D:
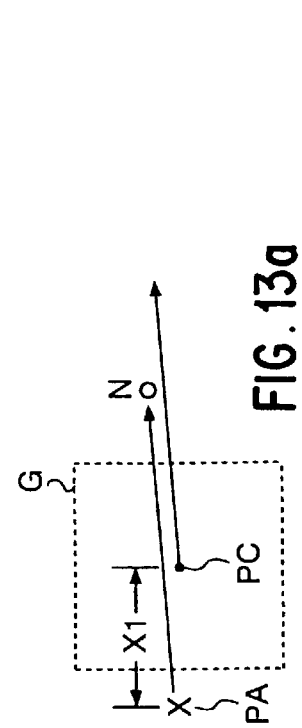
Figure 13E:
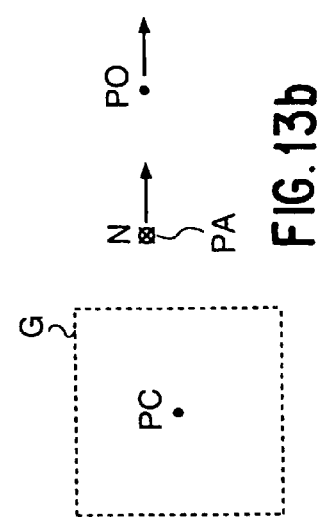
Figure 13F:
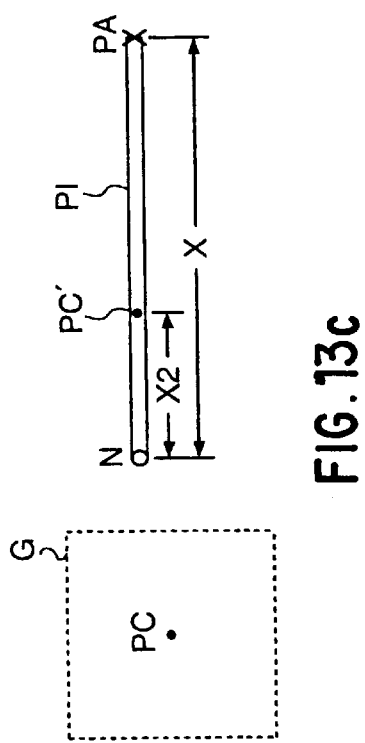

Then, the temporary substrate is returned in the X-axis direction by a given distance X2 as shown in FIG. 13(d). A position on the paste pattern P1 right under the nozzle at that time is determined as PC'. The temporary substrate is moved in the Y-axis direction by a given distance Y (Step 406a), and the paste is applied onto the temporary substrate and at the same time the temporary substrate is moved in the direction opposite to the direction moved in Step 406a by a distance 2×Y. By doing so, as shown in FIG. 13(f), a straight-line-shaped paste pattern P2 extending in the Y-axis direction having a length of 2×Y and intersecting with the paste pattern P1 at right angle at a position PC' is formed (Step 407a). After that, the nozzle 1 is moved upward (Step 408a).

Although the distance 2×Y, here, is set to a length longer than the length in the Y-axis direction of the view G of the image recognizing camera 11a, it is not always necessary to do so.

Next, the temporary substrate is moved so that the center of the intersection PC' of the paste patterns P1 and P2 agrees with the central point PC of the view G of the image recognizing camera 11a (Step 409a), and the center of the intersection PC' of the paste patterns P1 and P2 is measured by the image recognizing camera 11a in a manner as to be described later (Step 410a). The measured data is stored in the RAM in the micro-computer 14a (FIG. 3).

Therein, each of the distance in FIG. 13 is set in advance.

Figure 14:
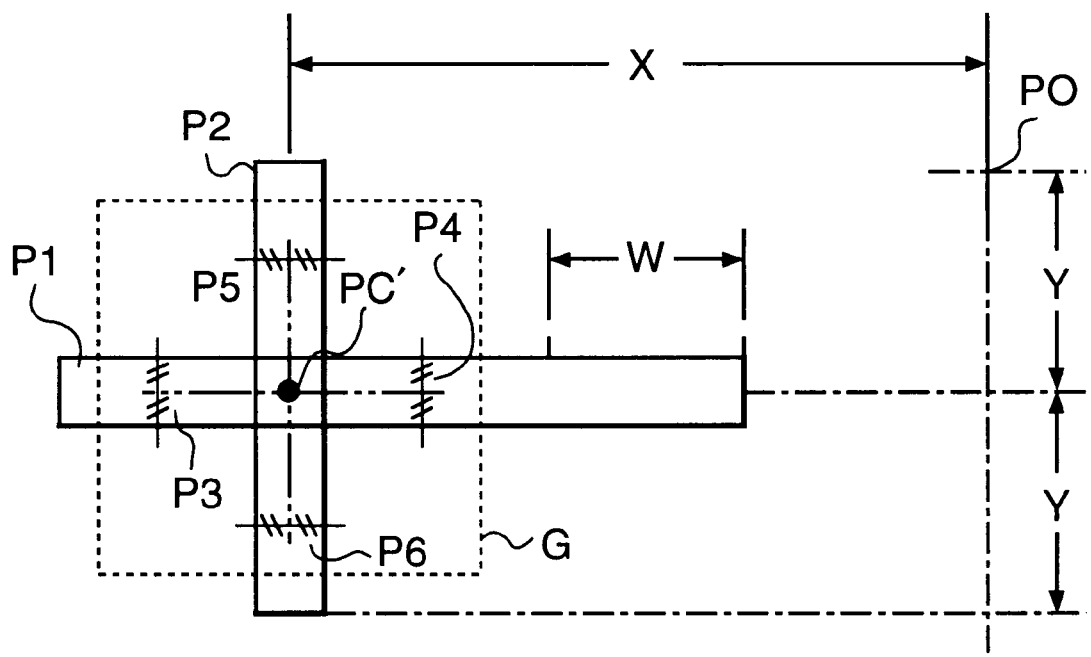
FIG. 14 is a diagram explaining the method of calculating an amount of displacement between the central point of an intersecting point of the two straight line-shaped paste patterns intersecting each other in FIG. 12 and the central point of view of a image recognizing camera.

FIG. 14 is a view showing a state where the paste patterns P1 and P2 formed on the temporary substrate is adjusted so that the center of the intersection PC' of the paste patterns agrees with the central point PC of the view G of the image recognizing camera 11a, and the portion corresponding to the portion in FIG. 13 is identified by the same reference character.

Each of the distances in the FIG. 13 and the positional relationship between the central point PC of the view G of the image recognizing camera 11a and the center of the paste discharging port of the nozzle 1 are known in advance. When the temporary substrate is moved from the state shown in FIG. 13(f) and positioned so that the center of the intersection PC' of the paste patterns P1, P2 agrees with the central point PC of the view G of the image recognizing camera 11a, the center of the intersection PC' of the paste patterns P1, P2 must agree with the central point PC of the view G of the image recognizing camera 11a. However, actually, the displacement occurs in them.

The displacement contains working accuracy of the paste reservoir tube 2 and the nozzle 1, the deviation in the assembling accuracy of the paste reservoir tube 2 and the nozzle 1 and the disagreement between the center of the nozzle and the center of the small amount of the paste discharged from the paste discharging port of the nozzle at the time when the nozzle is exchanged. One of the causes of the disagreement comes from cleaning at the time when the nozzle is exchanged. If the paste discharging port of the nozzle is carefully cleaned, it take an unnecessarily long time to exchange the nozzle and workability is degraded.

In this embodiment, the displacement due to the latter cause is to solve in a short time by the method to be described below.

That is, the straight-line-shaped paste pattern P1 drawn first is longer than the paste pattern P2 intersecting with the paste pattern P1 drawn next as shown in FIG. 14, and when the straight-line-shaped paste pattern P1 is drawn, a pre-drawing section having an arbitrary length W is provided at the starting portion of drawing of the paste pattern P1. That is, the paste pattern P1 is drawn longer than the paste pattern P2 by at least the length W of the pre-drawing section.

By doing so, a paste hanging to slightly one side from the paste discharging port of a new nozzle after nozzle change is removed by being applied onto the pre-drawing section of the starting portion of drawing on the temporary substrate. At a position after passing through the pre-drawing section, that is, in the view G of the image recognizing camera 11a, the paste patterns P1, P2 have nearly the same width as the diameter of the nozzle and the center in the width direction of the paste pattern agrees with the center of the paste discharging port.

As described above, the paste patterns P1, P2 without the effect of the paste hanging to one side in the paste discharging port is formed, and the temporary substrate is set in the state as shown in FIG. 14. After that, the image in the view G is read using the image recognizing camera 11a, and the processing proceeds to Step 410a in FIG. 12 of measuring operation of the central point of the intersection PC' of the paste patterns P1, P2 by processing the image information using the controller 14 (FIG. 1).

That is, in FIG. 14, phantom lines across the paste patterns P1, P2 in the view G of the image recognizing camera 11a are set on the image processing, and differential values of the image brightness on the phantom lines are calculated and two positions at which the change in the brightness becomes maximum are determined as the positions of the both edges of each of the paste patterns P1, P2. The middle position between the two position on each of the phantom lines is determined and these middle positions are determined as central points P3 to P6 in the width direction of the paste patterns P1, P2. Then, a phantom line connecting the two central points P3, P4 on the paste pattern P1 and a phantom line connecting the two central points P5, P6 on the paste pattern P2 are obtained and the position of the intersection of the two phantom lines is determined as the central point of the intersection of the paste patterns P1, P2. The central point is exactly the central position of the paste discharging port of the nozzle 1.

The above process is the process of Step 410a in FIG. 12. Then, using the data with regard to the central position of the paste discharging port of the nozzle 1 obtained as described above, an amount of displacement of the central point of the paste discharging port of the nozzle 1 from the central point PC of the view G of the image recognizing camera 11a, that is, an amount of positional displacement of the nozzle 1 is calculated (Step 411a). The amount of positional displacement of the nozzle 1 is stored in the RAM of the micro-computer 14a (FIG. 3).

Finally, the temporary substrate is released from attracting (Step 412a) and thus the nozzle displacement measurement process (Step 400a) is completed.

In FIG. 14, at the intersection PC' of the paste patterns P1, P2, the paste is repeated to be applied and the amount of the paste is more than that in the other portion. Therefore, in some cases, the paste spreads a little wider in this portion. However, there is no problem in the spreading of the paste because the central position of the intersection PC' is obtained through image processing not using the data with regard to the image of the region of the intersection PC'.

Further, even when the paste patterns P1, P2 are cut or drawn in such as to be cut at the portion of the intersection PC' in order to avoid paste spreading, the intersection can be easily determined. For example, in a case where the paste pattern P1 is continuously drawn and the paste pattern P2 is drawn so as to be cut at the intersection with the paste pattern P1, the paste pattern is divided into two straight lines and the central points P5, P6 in the width direction of the paste pattern P2 can be determined. Therefore, the intersection can be easily determined.

Furthermore, in Step 409a, it is not necessary that the central point of the intersection PC' of the paste patterns P1, P2 agrees with the central point PC of the view G of the image recognizing camera 11a. That is, if the central point of the intersection PC' of the paste patterns P1, P2 is within the view G of the image recognizing camera 11a, the moved distance can be determined by the micro-computer 14a itself. Therefore, by moving the central point of intersection PC' of the paste patterns P1, P2 toward the central point PC of the view G by calculation process, the amount of positional displacement of the nozzle 1 may be determined from the central point of the intersection PC' of the phantom paste patterns P1, P2 at that time and the central point PC of the view.

In the embodiments having been described above, the substrate 7 is moved in both of the X-axis direction and the Y-axis direction with regard to the paste reservoir tube 2. However, it is possible to fix the substrate 7 and to move the paste reservoir tube 2 together with the nozzle.

Further, in order to shorten the required time for the applicator initialization process (Step 200) in FIG. 5, by connecting a memory read-out device for an IC card or the external memory means 18 (FIG. 3) such as floppy disk, hard disk or the like to the external interface 14e (FIG. 3) and by performing setting of the various kinds of data required for the applicator initialization process using a personal computer or the like in advance, the data may be transmitted by off-line from the external memory means 18 to the RAM of the micro-computer 14a (FIG. 3) through the memory read-out device connected to the external interface 14e at applicator initialization period.

The modified embodiments described above may be arbitrarily combined.

As described above, according to the present invention, even when a position of the paste discharge port of a nozzle to a substrate is changed due to nozzle exchange, a paste pattern can be accurately drawn by positioning the nozzle and pattern can be accurately drawn by positioning the nozzle and the substrate in a desired positional relationship.

What is claimed is:

1. A paste applicator comprising:
   a table for detachably mounting a substrate;
   a paste reservoir tube to be filled with a paste;
   a nozzle communicating with said paste reservoir tube and having a paste discharging port facing an upper surface of said substrate mounted on said table, said upper surface defining an X-Y coordinate plane, said nozzle being exchangeable;
   a controller in controlling communication with said table and said nozzle, said control including:
      changing means for changing a relative positional relationship between said nozzle and said substrate mounted on the table in the X-Y coordinate plane and applying the paste onto said substrate to form a desired pattern of the paste;
      dot-shaped paste pattern forming means for forming a plurality of dot-shaped paste patterns separated from one another on the substrate after said nozzle has been exchanged together with said paste reservoir tube;
      measuring means for measuring a position in the X-Y coordinate plane of the paste discharging port of said nozzle after the nozzle has been exchanged using said plurality of dot-shaped paste patterns;
      calculating means for calculating a positional displacement in the X-Y coordinate plane of the paste discharging port after the nozzle has been exchanged, through statistical processing of the position in the X-Y coordinate plane measured by said measuring means with respect to all of the dot-shaped paste patterns; and
      positioning means for positioning said substrate to a desired position in the X-Y coordinate plane with respect to the paste discharging port after the nozzle has been exchanged, based on said positional displacement.

2. A paste applicator according to claim 1, wherein said controller further includes memory means for storing information indicating whether operation of positioning of the substrate to the paste discharge port of a new nozzle after the nozzle has been exchanged.

3. A paste applicator comprising:
   a table for detachably mounting a substrate;
   a paste reservoir tube to be filled with a paste;
   a nozzle communicating with said paste reservoir tube and having a paste discharging port facing an upper surface of said substrate mounted on said table, said upper surface defining an X-Y coordinate plane, said nozzle being exchangeable;
   a controller in controlling communication with said table and said nozzle, said controller including:

changing means for changing a relative positional relationship between said nozzle and said substrate mounted on the table in the X-Y coordinate plane and applying the paste onto said substrate to form a desired pattern of the paste;

dot-shaped paste pattern forming means for forming a plurality of dot-shaped paste patterns separated from one another on the substrate after said nozzle has been exchanged together with said paste reservoir tube;

measuring means for measuring a position in the X-Y coordinate plane of the paste discharging port of said nozzle after the nozzle has been exchanged using said plurality of dot-shaped paste patterns;

calculating means for calculating a positional displacement in the X-Y coordinate plane of the paste discharging port after the nozzle has been exchanged, through statistical processing of the position in the X-Y coordinate plane measured by said measuring means with respect to all of the dot-shaped paste patterns except for the dot-shaped pattern applied first; and positioning means for positioning said substrate to a desired position in the X-Y coordinate plane with respect to the paste discharging port after the nozzle has been exchanged, based on said positional displacement.

4. A paste applicator comprising:

a table for detachably mounting a substrate;

a paste reservoir tube to be filled with a paste;

a nozzle communicating with said paste reservoir tube and having a paste discharging port facing an upper surface of said substrate mounted on said table, said upper surface defining an X-Y coordinate plane, said nozzle being exchangeable;

a controller in controlling communication with said table and said nozzle, said controller including:

changing means for changing a relative positional relationship between said nozzle and said substrate mounted on the table in the X-Y coordinate plane and applying the paste onto said substrate to form a desired pattern of the paste;

dot-shaped paste pattern forming means for forming a plurality of dot-shaped paste patterns separated from one another on the substrate after said nozzle has been exchanged together with said paste reservoir tube;

measuring means for measuring a position in the X-Y coordinate plane of the paste discharging port of said nozzle after the nozzle has been exchanged using said plurality of dot-shaped paste patterns;

calculating means for calculating a positional displacement in the X-Y coordinate plane of the paste discharging port after the nozzle has been exchanged, through statistical processing of the position in the X-Y coordinate plane measured by said measuring means with respect to the dot-shaped paste pattern applied last; and positioning means for positioning said substrate to a desired position in the X-Y coordinate plane with respect to the paste discharging port after the nozzle has been exchanged, based on said positional displacement.

5. A paste applicator comprising:

a table for detachably mounting a substrate;

a paste reservoir tube to be filled with a paste;

a nozzle communicating with said paste reservoir tube and having a paste discharging port facing an upper surface of said substrate mounted on said table, said upper surface defining an X-Y coordinate plane, said nozzle being exchangeable;

a controller in controlling communication with said table and said nozzle, said controller including:

changing means for changing a relative positional relationship between said nozzle and said substrate mounted on the table in the X-Y coordinate plane and applying the paste onto said substrate to form a desired pattern of the paste;

straight line-shaped paste pattern forming means for forming a first and a second straight line-shaped paste pattern intersecting each other on the substrate after said nozzle has been exchanged together with said paste reservoir tube;

measuring means for measuring a position in the X-Y coordinate plane of the paste discharging port of said nozzle after the nozzle has been exchanged using the central point of the intersecting point of both of the paste patterns;

calculating means for calculating a positional displacement in the X-Y coordinate plane of the paste discharging port after the nozzle has been exchanged, through statistical processing of the position in the X-Y coordinate plane measured by said measuring means with respect to the central point of the intersecting point of both of the paste patterns; and positioning means for positioning said substrate to a desired position in the X-Y coordinate plane with respect to the paste discharging port after the nozzle has been exchanged bagged on said positional displacement.

6. A paste applicator according to claim 5, wherein said measuring means comprises relative moving means for changing the relative positional relationship between the substrate and the table in the X-Y coordinate plane so that the first paste pattern applied is longer than the second paste pattern applied and the long portion of the first paste pattern is the starting portion of drawing when the first and the second straight line-shaped patterns intersecting each other are drawn onto the substrate using the nozzle exchanged.

* * * * *